(12) United States Patent
Triebe et al.

(10) Patent No.: US 7,222,490 B2
(45) Date of Patent: May 29, 2007

(54) NMR SPECTROMETER WITH REFRIGERATOR COOLING

(75) Inventors: René Triebe, Zuerich (CH); Daniel Marek, Moeriken (CH); Oskar Schett, Uster (CH); Daniel Guy Baumann, Russikon (CH)

(73) Assignee: Bruker Biospin AG, Faellanden (CH)

( * ) Notice: Subject to any disclaimer, the term of this patent is extended or adjusted under 35 U.S.C. 154(b) by 73 days.

(21) Appl. No.: 11/236,555

(22) Filed: Sep. 28, 2005

(65) Prior Publication Data
US 2006/0096301 A1 May 11, 2006

(30) Foreign Application Priority Data
Nov. 9, 2004 (DE) ............ 10 2004 053 973

(51) Int. Cl.
*F25B 9/00* (2006.01)

(52) U.S. Cl. .......................... 62/6; 62/51.1

(58) Field of Classification Search .......... 62/45, 62/48.4, 51.1, 54, 6, 259.2
See application file for complete search history.

(56) References Cited

U.S. PATENT DOCUMENTS 4,277,949 A * 7/1981 Longsworth ............ 62/47.1

(Continued)

FOREIGN PATENT DOCUMENTS

JP 2004219361 8/2004

(Continued)

OTHER PUBLICATIONS

"RE-liquefying nitrogen gas for superconducting magnet", http://www.jastec.org/eg/product/chisso/chisso.html.

(Continued)

*Primary Examiner*—Melvin Jones
(74) *Attorney, Agent, or Firm*—Paul Vincent

(57) ABSTRACT

An NMR spectrometer comprising an NMR magnet system (27) disposed in a helium tank of a cryostat and an NMR probe head (11) disposed in a room temperature bore of the cryostat, which contains a cooled RF resonator (9) for receiving NMR signals from a sample to be investigated, and a cooled pre-amplifier (10), wherein the NMR probe head (11) is cooled by a common multi-stage compressor-operated refrigerator (2), wherein the refrigerator (2) comprises a cold head and several heat exchangers (5, 6) at different temperature levels, wherein the refrigerator (2) is disposed at a spatial separation from the cryostat in a separate, evacuated and thermally insulated housing (1) and wherein at least one cooling circuit with cooling lines, which are thermally insulated by a transfer line (13, 14) is disposed between the housing (1) containing the heat exchangers (5, 6) and the NMR probe head (11), is characterized in that additional cooling lines to an $LN_2$ tank (18) or radiation shield (21) disposed in the cryostat and surrounding the helium tank are provided, and the refrigerator (2) also cools the $LN_2$ tank (18) or the radiation shield (21). The inventive NMR spectrometer comprises a simple and inexpensive device for matching the holding time of $LN_2$ to that of LHe through cooling the $LN_2$ tank using the refrigerator provided for cooling the NMR probe head and without great expense.

19 Claims, 4 Drawing Sheets

U.S. PATENT DOCUMENTS

| | | | |
|---|---|---|---|
| 4,796,433 A | | 1/1989 | Bartlett |
| 5,220,800 A | * | 6/1993 | Muller et al. ................. 62/51.1 |
| 5,508,613 A | * | 4/1996 | Kotsubo et al. ............ 324/318 |
| 5,744,959 A | * | 4/1998 | Jeker et al. ................. 324/319 |
| 5,889,456 A | | 3/1999 | Triebe |

FOREIGN PATENT DOCUMENTS

| | | |
|---|---|---|
| WO | WO 01/96020 | 12/2001 |
| WO | WO 03/023433 | 3/2003 |

OTHER PUBLICATIONS

"ActivelyCooled™: a new cryogen-free technology for NMR" http://www.oxinet.com/SCHNWP723.htm.

"CryoPlatform™" http://www.bruker-biospin.com/nmr/products/crp.platform.html.

"Cold Probes—Cryogenic Cooling System" http://www.varianinc.com/cgi-bin/nav?products/nmr/probes/liquids/cold_probes/cold_system . . . .

* cited by examiner

NMR SPECTROMETER WITH REFRIGERATOR COOLING

This application claims Paris Convention priority of DE 10 2004 053 973.1 filed Nov. 09, 2004 the complete disclosure of which is hereby incorporated by reference.

BACKGROUND OF THE INVENTION

The invention concerns an NMR spectrometer with an NMR magnet system disposed in the helium tank of a cryostat, and with an NMR probe head disposed in a room temperature bore of the cryostat which contains a cooled RF resonator for receiving NMR signals from a sample to be examined, and with a cooled pre-amplifier, wherein the NMR probe head is cooled by a common multi-stage compressor-operated refrigerator, the refrigerator comprising a cold head and several heat exchangers at different temperature levels, wherein the refrigerator is disposed at a spatial separation from the cryostat in a separate, evacuated and thermally insulated housing, and wherein at least one cooling circuit is provided comprising cooling lines, which are thermally insulated by a transfer line, extending between the housing containing the heat exchangers and the NMR probe head.

A device of this type is disclosed in U.S. Pat. No. 5,889,456.

The NMR probe head of an NMR spectrometer is located together with a measuring device in the bore of a magnet cryostat. This magnet cryostat houses a superconducting coil which generates the magnetic field required for the NMR measurements. The NMR probe head as well as the magnet cryostat must be kept at very low temperatures during operation. The thermal loss generated through thermal conduction and thermal radiation is therefore a problem.

Two important fields of application of cryocooling systems in the field of NMR are therefore cooling of the cryo probe heads for cryogenic cooling of the RF resonator and of the pre-amplifier and for cooling the superconducting NMR magnets for cryogenic cooling of the cryostat and therefore realization of a zero evaporation rate both for $LN_2$ and LHe ($LN_2$=liquid nitrogen, LHe=liquid helium).

Different systems from different companies are on the market today which are designed to solve this problem. The company JASTEC (Japan) [1] provides a cooling system for cooling the $LN_2$ region of a cryostat for superconducting magnet systems up to 400 MHz. It contains a low-vibration pulse tube cooling unit which, however, has a maximum cooling power of less than that of conventional GM cooling units (GM=Gifford-McMahon). A zero evaporation rate for $LN_2$ is therefore achieved only for NMR magnet systems of up to at most 400 MHz.

The company NIHON THERMAL (Japan) [2] provides a cooling system for cooling the $LN_2$ region of a cryostat for superconducting magnets up to 600 MHz. It contains a powerful GM unit which generates stronger vibrations than that of JASTEC but provides a zero evaporation rate for $LN_2$ at 600 MHz magnet systems.

There are conventional superconducting NMR magnets made by the company OXFORD INSTRUMENTS SUPERCONDUCTIVITY (GB) [3], which comprise a cooling system for cooling the $LH_2$ and the LHe regions of the cryostat. The cooling system utilizes a low-vibration pulse tube cooling unit which is directly mounted to the cryostat and achieves a zero evaporation rate both for $LN_2$ and for LHe.

The company Bruker BioSpin AG [4] and the company VARIAN (USA) [5] each distribute a cooling system called "CryoPlatform" (Bruker BioSpin) and "Cryo Bay" (Varian) for cryogenic cooling of RF resonators. These two cooling systems contain a GM cooling unit and use cold He gas as transport and cooling means.

U.S. Pat. No. 5,889,456 discloses a device comprising a refrigerator for cooling the NMR probe head. Heat exchangers and a transfer line from the refrigerator to the NMR probe head transfer the cooling power produced by the refrigerator. The NMR probe head is supplied with coolant by pumps or compressors via the transfer lines. The cooled components of the probe head are usually at temperatures of 10–60 Kelvin. A Gifford-MacMahon cooler (GM) or a pulse tube cooler (PT) are usually used as refrigerators.

In the majority of NMR magnet systems without active cryocooling, the holding time for LHe is more than 6 months, however, only two to three weeks for $LN_2$. The short holding time for $LN_2$ is due to cryostat construction only and applies as long as no excessive expense is incurred for thermal shielding of the $LN_2$ tank.

The $LN_2$ loss is on the order of magnitude of 10–20 Watt at approximately 77K which could be easily compensated for with a small active cooling unit. Small units with low power also require different basic units such as e.g. compressors, and are therefore not inexpensive. The expense required to solve only the object of reducing or completely compensating for the $LN_2$ loss may therefore often be too high.

It is therefore the underlying purpose of the invention to propose an NMR spectrometer which permits matching of the holding time of $LN_2$ to that of LHe without great expense to reduce the service costs associated with refilling the cryogenic liquids.

SUMMARY OF THE INVENTION

This object is achieved in accordance with the invention by providing additional cooling lines for a nitrogen tank or radiation shield disposed in the cryostat and surrounding the helium tank, wherein the refrigerator also cools the nitrogen tank or the radiation shield.

The cooling device for cooling the NMR probe head can be dimensioned in such a manner that it can discharge excessive cooling power at approximately 34 K to compensate for the $LN_2$ loss, practically without additional expense. Towards this end, part of the helium gas at a temperature of approximately 34K is not only used to cool the pre-amplifier but is guided via a further transfer line to a heat exchanger which is in close contact with the evaporated $N_2$ gas of the $LN_2$ tank and partially or completely recondensates this gas. The $LN_2$ consumption can thereby be strongly reduced and both the LHe and $LN_2$ tanks can be refilled at the same time, e.g. only every 7 months. This avoids the need of refilling every two to three weeks due to the $LN_2$ loss.

This idea is surprising in view of the simple solution of cooling of the $LN_2$ tank and can be realized in an inexpensive manner. The simplicity of this solution has the further advantage that the required constructional components can also be designed as retrofit units. NMR spectrometers already operating in the field can thereby be retrofitted with inexpensive $LN_2$ cooling.

In a particularly simple embodiment of the inventive NMR spectrometer, the refrigerator only cools the nitrogen tank or the radiation shield and not the helium tank in the cryostat.

In a preferred embodiment of the present NMR spectrometer, the cooling lines leading to the RF resonator, the pre-amplifier and to the NMR magnet system have a common thermally insulated section within a transfer line which comprises at least 50%, preferably approximately 90% of the overall length of the transfer lines, to reduce the temperature loss during transfer of the coolants to the objects being cooled.

In a particularly preferred embodiment of the invention, the cooling lines with the lowest energy level are thermally shielded from at least one radiation shield with a higher energy level within the common thermally insulated section. The cooling lines at the lowest energy level are thereby subjected to a reduced temperature difference to reduce the energy loss and the insulation requirements for the line section.

In a preferred embodiment, the transfer lines have vibration-damping components for decoupling from the refrigerator and NMR sample or from the refrigerator and cryostat, thereby improving the quality of the NMR measurements.

A cooling circuit is preferably provided between the housing and the cryostat having a return path temperature of approximately 77K. A cooling circuit of this type is suited, in particular, for cooling the radiation shield or the nitrogen tank.

Moreover, two cooling circuits are advantageously provided between the housing and the NMR probe head, wherein one cooling circuit has a return path temperature of approximately 77K and preferably cools a pre-amplifying electronics in the NMR probe head.

In a particularly advantageous manner, a common cooling circuit is provided between the housing, the cryostat and the NMR probe head, whose return path temperature is at approximately 77K and which preferably cools a pre-amplifying electronics in the probe head and a nitrogen tank or a radiation shield in the cryostat to ensure particularly effective utilization of the cooling power of the refrigerator.

In a particular embodiment, the cooling circuits with a return path temperature of approximately 77K are operated with gaseous helium as coolant.

In a further embodiment of the inventive NMR spectrometer, one of the cooling circuits located between the housing and the NMR probe head has a return path temperature of approximately 15K and is operated with gaseous helium as coolant.

In a particularly preferred embodiment of the inventive NMR spectrometer, the common refrigerator comprises at least one stage exchanger along which at least one coolant is guided such that this coolant is precooled to a defined temperature. One of the heat exchangers can thereby be omitted. There is the additional possibility to individually adjust the temperature of the coolant through selection of the length of the contact surface between the transfer line and the regenerator.

The common refrigerator is preferably a Gifford-McMahon cooler or a pulse tube cooler. In particular, use of a pulse tube cooler considerably facilitates mounting of the transfer lines to the stationary regenerator tube and therefore the temperature exchange.

Moreover, the refrigerator compressor may also drive at least one of the cooling circuits. No additional compressor is required in this case.

With particular preference, the cooling circuit cooling a nitrogen tank or a radiation shield comprises a valve for regulating the coolant flow and a heat exchanger which is in thermal contact with the nitrogen tank or radiation shield.

In a special embodiment of the inventive NMR spectrometer, the cooling circuits form a helium circuit with at least one branch in the forward and/or return path.

Further advantages of the invention can be extracted from the description and the drawing. The features mentioned above and below may be used either individually or collectively in arbitrary combination. The embodiments shown and described are not to be understood as exhaustive enumeration but have exemplary character for describing the invention.

DESCRIPTION OF THE PREFERRED EMBODIMENT

Figure 1:
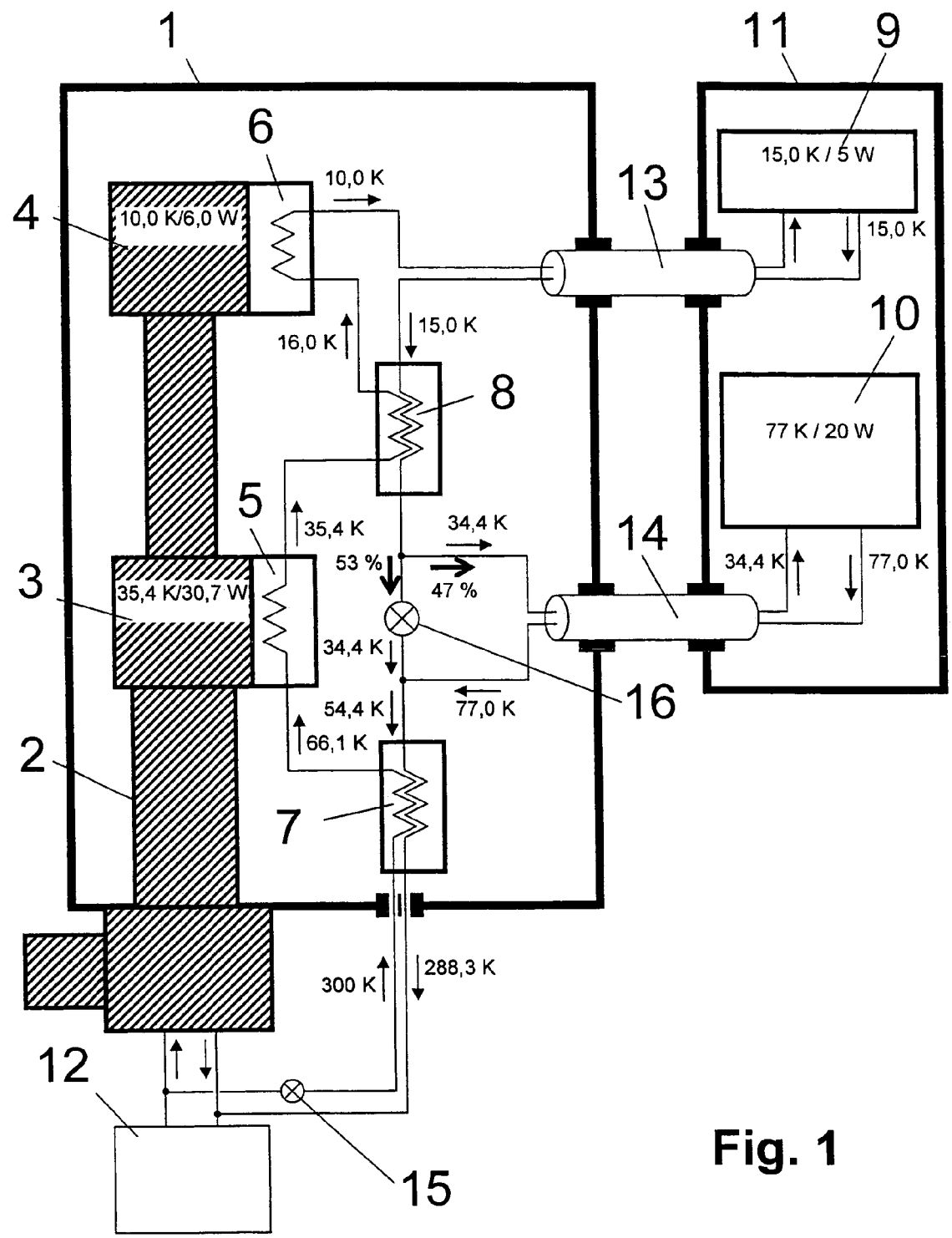
FIG. 1 shows a cooling device in accordance with prior art.

FIG. 1 shows a conventional cooling device comprising an evacuated and thermally insulated housing 1 which houses a refrigerator 2 with a first cold stage 3 and a second cold stage 4 and stage exchangers 5, 6 as well as counter current heat exchangers 7, 8. The cooling device cools an RF resonator 9 and a pre-amplifier 10 which are both parts of an NMR probe head 11. A similar variant is described in U.S. Pat. No. 5,889,456 which differs, however, in that the helium gas of the closed gas circuit is not circulated with a separate circulating pump but with the helium compressor 12 of the refrigerator 2 (similar to the U.S. Pat. No. 5,508,613).

Helium gas, which flows in one or more closed circuits, is used to transport the cooling power. The housing 1 and the NMR probe head 11 are connected to each other via transfer lines 13, 14, thereby closing the helium gas cooling circuit for cooling the RF resonator 9 and pre-amplifier 10. The NMR probe head 11 and the two transfer lines 13, 14 are evacuated as is the housing 1, to prevent thermal loss due to thermal conduction via air. The refrigerator 2 providing the cooling power for cooling the RF resonator 9 and the pre-amplifier 10 is connected to the compressor 12 via gas lines. The first cold stage 3 of the refrigerator 2 is at approximately 35.4 K and the second cold stage 4 at approximately 10 K. Both cold stages 3, 4 have thermal tapping surfaces which serve as cooling sources and to which various individual parts can be connected and cooled. Individual parts of this type are stage exchangers 5, 6 which are connected to the first 3 or second cold stage 4 of the refrigerator 2.

The compressor 12 circulates the helium gas of the closed cooling circuit. The coolant flow of the cooling circuit is adjusted via a valve 15. The helium gas from the compressor 12 enters into the housing 1 at approximately room temperature (300K) and is initially pre-cooled to 66.1 K using the first counter current heat exchanger 7 and then to 35.4 K in the stage exchanger 5 of the first cold stage 3 of the refrigerator 2 before it reaches the second counter current heat exchanger 8. The helium gas is cooled there to 16 K and to the final temperature of 10 K in the downstream stage exchanger 6 of the second cold stage 4. This cold gas is supplied to the RF resonator 9 via the transfer line 13, thereby cooling the RF resonator to 15 K. The gas heated to 15 K is subsequently supplied to the housing 1 via the transfer line 13 and to the counter current heat exchanger 8. Downstream of the counter current heat exchanger 8, part of the gas cooled down to 34.4. K (approximately 53%) is returned to the compressor 12 via the counter current heat exchanger 7. The other part of the gas cooled down to 34.4 K (approximately 47%) is guided to the pre-amplifier 10 via the transfer line 14, thereby cooling it to 77 K. The gas heated to 77 K is subsequently guided via the transfer line 14 into the housing 1 and via the counter current heat exchanger 7 to the compressor 12. The coolant flow through the pre-amplifier 10 is adjusted by a valve 16.

Figure 2:
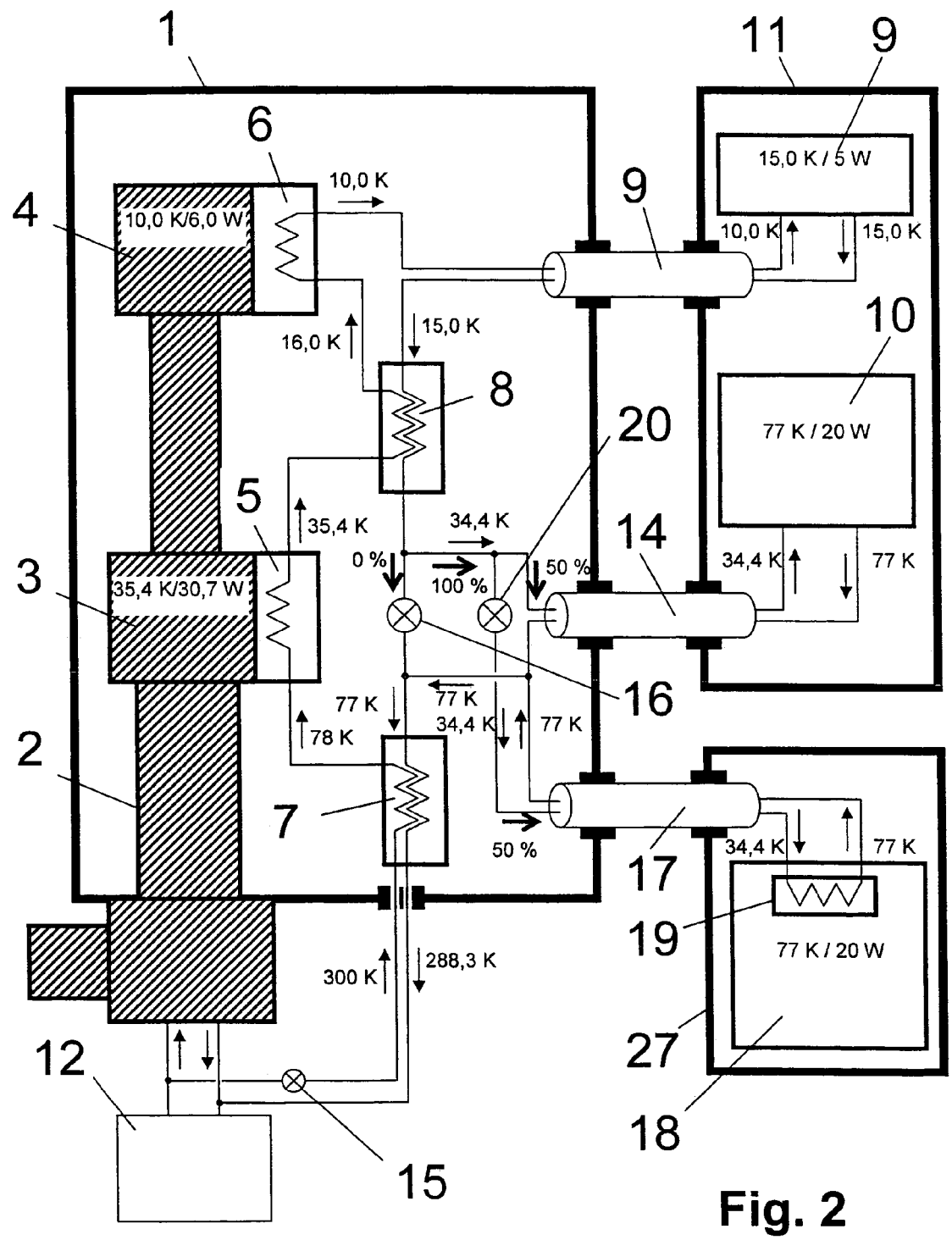
FIG. 2 shows an inventive cooling device with an additional cooling circuit for cooling an $LN_2$ tank.

FIG. 2 shows a schematic illustration of an embodiment of an inventive NMR spectrometer with an additional cooling circuit, wherein the cold helium gas is guided via an additional transfer line 17 to a $LN_2$ tank 18 of an NMR magnet system 27, where the evaporated nitrogen gas is partially or completely recondensated using a heat exchanger 19. That part of the helium gas having a temperature of approximately 34 K is thereby not used to cool the pre-amplifier 10, but part thereof is guided via a further transfer line 17 to the heat exchanger 19 which is in close contact with the evaporated $N_2$ gas of the $LN_2$ tank 18 and partially or completely recondensates this gas. The helium gas may be distributed between the pre-amplifier 10 and the $LN_2$ tank 18 (shown in FIG. 2) in such a manner that 50% is distributed to the pre-amplifier 10 and 50% to the $LN_2$ tank 18. The valves 16 and 20 serve to adjust the two He mass flows, namely to the pre-amplifier 10 and to the $LN_2$ tank 18 of the NMR magnet system 27. In this manner the $LN_2$ tank 18 of the magnet system 27 of an NMR spectrometer can be cooled merely by mounting an additional transfer line 17 and an additional valve 20. No additional refrigerator and compressor are required.

Figure 3:
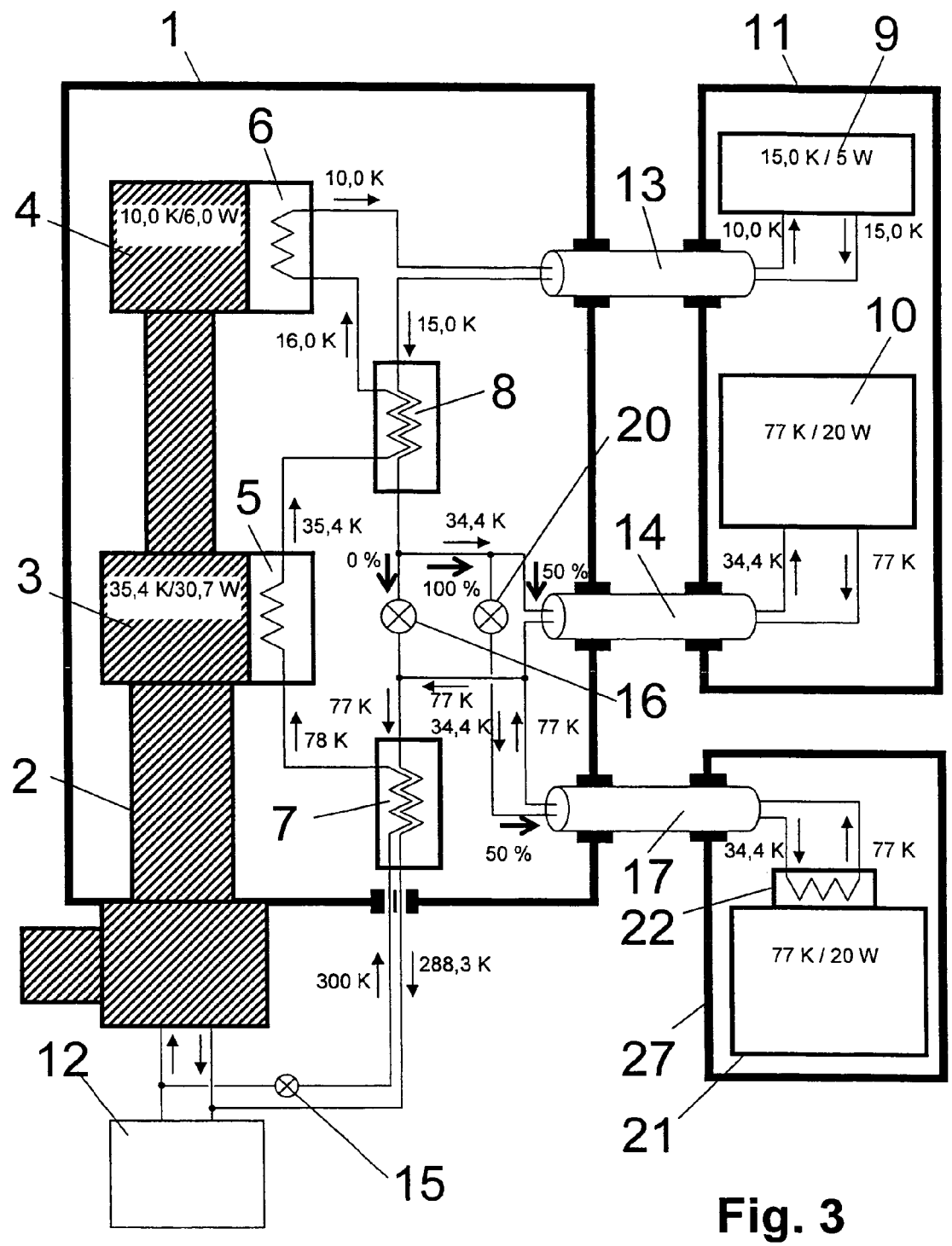
FIG. 3 shows an inventive cooling device with an additional cooling circuit for cooling a radiation shield.

In addition to the embodiment of FIG. 2, wherein the $LN_2$ tank 18 of the NMR magnet system 27 is cooled by the additionally provided transfer line 17, there is another possibility to cool a radiation shield 21 which is disposed around an LHe tank by the transfer line 17. This embodiment of the inventive NMR spectrometer is shown in FIG. 3. In this case, the cold helium gas is supplied via the transfer line 17 to a heat exchanger 22 which is in close thermal contact with the radiation shield 21. The radiation shield 21 is cooled by the thermal transfer in the heat exchanger 22.

Figure 4:
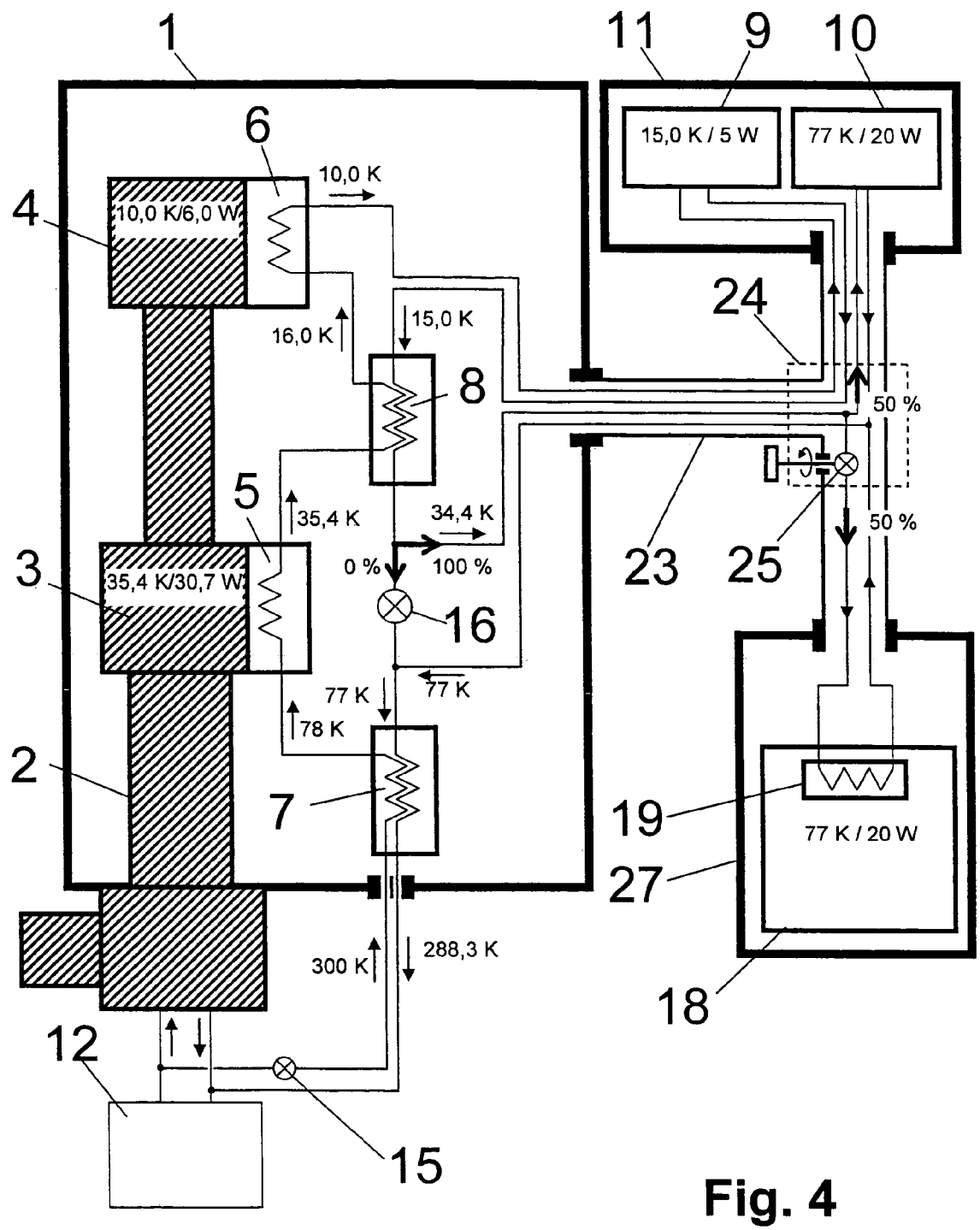
FIG. 4 shows an inventive cooling device with a T-shaped transfer line.

FIG. 4 shows an embodiment of the inventive device with a T-shaped transfer line 23. The cooling circuits are thereby not branched off within the housing 1 but in the branching region 24 of the T-shaped transfer line 23. The valve 25 which is located in the branching off region 24 of the T-shaped transfer line 23 thereby assumes the function of the valve 20. The three individual transfer lines 13, 14, 17 of the above-described embodiments are thereby combined in one single T-shaped transfer line 23 with a branching-off region 24. The T-shaped transfer line 23 has an additional section 26 which starts at the housing 1 and terminates in the branching-off region 24, wherein in this section 21, the cooling lines to the pre-amplifier 10 and those to the NMR magnet system 27 are each combined into one single feed and return line, wherein these feed and return lines and the feed and return lines to the RF resonator 9 are within the same thermally insulated space of the transfer line 23 and are guided parallel to each other. This provides the preconditions for thermally shielding the cooling lines at the lowest energy level (cooling lines to the RF resonator 9) using a radiation shield which is at a higher energy level and is in close thermal contact with the cooling lines to the pre-amplifier 10 and NMR magnet system 27. The cooling losses in the cooling lines to the RF resonator 9 are thereby considerably reduced. The valve 16 in the housing 1 and the valve 25 in the branching-off region 24 of the T-shaped transfer line 23 adjust the He mass flows at approximately 34 K to the pre-amplifier 10 and to the $LN_2$ tank 18 of the NMR magnet system 27. Cooling of a radiation shield 21 via a T-shaped transfer line 23 of this type is, of course, also possible.

One obtains a simple and inexpensive overall device which permits matching of the holding time of $LN_2$ to that of LHe through cooling the $LN_2$ tank using the refrigerator provided for cooling the NMR probe head and without great expense.

REFERENCE LIST

[1] http://www.jastec.org/eg/product/chisso/chisso.html
[2] http://www.j-thermal.co.jp/jnrs-400.html
[3] http://www.oxinst.com/SCNNWP723.htm
[4] http://www.bruker-biospin.com/nmr/products/crp_platform.html
[5] http://www.varianinc.com/cgi-bin/nav?products/nmr/probes/liquids/cold_-probes/cold_system&cid=OHQOMQKFN

LIST OF REFERENCE NUMERALS

1 housing
2 refrigerator
3 first stage of the refrigerator
4 second stage of the refrigerator
5 stage exchanger of the first stage of the refrigerator
6 stage exchanger of the second stage of the refrigerator
7 first counter current heat exchanger
8 second counter current heat exchanger
9 RF resonator
10 pre-amplifier
11 NMR probe head
12 compressor
13 transfer line to the RF resonator
14 transfer line to the pre-amplifier
15 valve
16 valve
17 transfer line to the NMR magnet system
18 $LN_2$ tank
19 heat exchanger of the $LN_2$ tank
20 valve
21 radiation shield
22 heat exchanger of the radiation shield
23 T-shaped transfer line
24 branching-off region of the T-shaped transfer line
25 valve
26 common section of the transfer line
27 NMR magnet system

We claim:
1. An NMR spectrometer for investigating a sample, the spectrometer comprising:
   a cryostat having a room temperature bore;
   a helium tank disposed in said cryostat;
   an NMR magnet system disposed in said helium tank;
   an NMR probe head disposed in said room temperature bore, said probe head having a cooled RF resonator for receiving NMR signals from the sample and a cooled pre-amplifier;
   an evacuacted and thermally insulated housing disposed outside of said cryostat;

a multi-stage compressor-operated refrigerator disposed in said housing, said refrigerator having a cold head and several heat exchangers at different temperatures;

a least one cooling circuit having first cooling lines communicating with said refrigerator and communicating with said probe head to cool said probe head with said refrigerator;

at least one transfer line, disposed between said housing and said probe head and structured to thermally insulate said cooling lines;

a $LN_2$ tank or radiation shield disposed in said cryostat and surrounding said helium tank; and second cooling lines communicating with said refrigerator and said helium tank or radiation shield by means of which said refrigerator cools said $LN_2$ tank or radiation shield.

2. The NMR spectrometer of claim 1, wherein-said refrigerator cools said $LN_2$ tank or radiation shield but does not cool said helium tank.

3. The NMR spectrometer of claim 1, wherein said first and second cooling lines have a common thermally insulated section within said transfer line which comprises at least 50% of an overall length of said transfer line.

4. The NMR spectrometer of claim 3, wherein said common section comprises approximately 90% of said overall transfer line length.

5. The NMR spectrometer of claim 3, wherein cooling lines with a lowest energy level are thermally shielded by at least one cooling line radiation shield at a higher energy level and within said common thermally insulated section.

6. The NMR spectrometer of claim 1, wherein said transfer line comprises vibration-damping components for decoupling said refrigerator from said NMR probe head or said cryostat.

7. The NMR spectrometer of claim 1, wherein a cooling circuit is provided between said housing and said cryostat having a return path at a temperature level of approximately 77 K.

8. The NMR spectrometer of claim 1, wherein two cooling circuits are provided between said housing and said NMR probe head, wherein one cooling circuit thereof has a return path temperature of approximately 77K.

9. The NMR spectrometer of claim 8, wherein said one cooling circuit at 77 K cools a pre-amplifying electronics in said NMR probe head.

10. The NMR spectrometer of claim 1, wherein a common cooling circuit is provided between said housing, said cryostat, and said NMR probe head having a return path temperature of approximately 77 K.

11. The NMR spectrometer of claim 10, wherein said common cooling circuit cools a pre-amplifying electronics in said NMR probe head and said $LN_2$ tank or radiation shield in said cryostat.

12. The NMR spectrometer of claim 8, wherein said one cooling circuit is operated with gaseous helium coolant.

13. The NMR spectrometer of claim 1, wherein a cooling circuit extending between said housing and said NMR probe head has a return path temperature of approximately 15K and is operated with gaseous helium coolant.

14. The NMR spectrometer of claim 1, wherein said refrigerator comprises at least one stage exchanger along which at least one coolant is guided to pre-cool said coolant to a defined temperature.

15. The NMR spectrometer of claim 1, wherein said refrigerator is a Gifford-McMahon cooler.

16. The NMR spectrometer of claim 15, wherein said refrigerator is a pulse tube cooler.

17. The NMR spectrometer of claim 1, wherein said compressor of said refrigerator additionally drives at least one of said cooling circuits.

18. The NMR spectrometer of claim 1, wherein a circuit cooling said $LN_2$ tank or radiation shield comprises a valve for regulating a coolant flow and a heat exchanger which is in thermal contact with said $LN_2$ tank or radiation shield.

19. The NMR spectrometer of claim 1, wherein said cooling circuits form a helium circuit with at least one branch in a forward and/or return path.

* * * * *